(12) United States Patent
Fan

(10) Patent No.: US 7,878,870 B2
(45) Date of Patent: Feb. 1, 2011

(54) ELECTRICAL CONTACT HAVING IMPROVED SOLDERING SECTION OF HIGH COMPLIANCE

(75) Inventor: Chia-Wei Fan, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/569,913

(22) Filed: Sep. 30, 2009

(65) Prior Publication Data
US 2010/0081329 A1    Apr. 1, 2010

(30) Foreign Application Priority Data
Sep. 30, 2008    (TW) ................... 97217528

(51) Int. Cl.
*H01R 4/48*    (2006.01)
(52) U.S. Cl. .................. 439/862; 439/876; 439/71
(58) Field of Classification Search .............. 439/71, 439/342, 857, 862, 876
See application file for complete search history.

(56) References Cited

U.S. PATENT DOCUMENTS

| | | | |
|---|---|---|---|
| 6,056,558 A * | 5/2000 | Lin et al. ................ | 439/83 |
| 6,824,414 B2 * | 11/2004 | Whyne et al. ........... | 439/342 |
| 6,827,586 B2 | 12/2004 | Molex et al. | |
| 6,957,987 B2 * | 10/2005 | Ma et al. ............... | 439/733.1 |
| 6,976,888 B2 * | 12/2005 | Shirai et al. ........... | 439/862 |
| 7,291,021 B2 * | 11/2007 | Shirai et al. ........... | 439/71 |
| 7,563,105 B2 * | 7/2009 | Liu et al. ............... | 439/66 |
| 7,578,675 B2 * | 8/2009 | Polnyl et al. .......... | 439/66 |
| 7,771,244 B1 * | 8/2010 | Ju ......................... | 439/857 |
| 2003/0064620 A1 * | 4/2003 | Hsu ....................... | 439/342 |
| 2003/0068916 A1 * | 4/2003 | Ju ......................... | 439/342 |
| 2004/0058580 A1 * | 3/2004 | Shirai et al. ........... | 439/342 |
| 2007/0281507 A1 | 12/2007 | Hon Hai | |
| 2010/0081329 A1 * | 4/2010 | Fan ....................... | 439/626 |

FOREIGN PATENT DOCUMENTS

TW    M330618    4/2008

* cited by examiner

*Primary Examiner*—James Harvey
(74) *Attorney, Agent, or Firm*—Andrew C. Cheng; Wei Te Chung; Ming Chieh Chang

(57) ABSTRACT

An electrical contact (3) includes a body section (30), a contacting arm (31) extending upward from the body section (30), a soldering section (32) formed by cutting out from the body section and then extending outwardly. The soldering section (32) comprising a first extending arm (321) connected to the body section (30), a second extending arm (322) bent downwardly from the first extending arm (321), and a soldering pad (323) extending from the second extending arm (322) toward the body section (30). An opening (300) is defined after the soldering section (30) is cut out from the body section.

15 Claims, 2 Drawing Sheets

ELECTRICAL CONTACT HAVING IMPROVED SOLDERING SECTION OF HIGH COMPLIANCE

BACKGROUND OF THE INVENTION

1. Field of the Invention

The present invention relates to an electrical contact used in a connector, and more particularly to to an electrical contact substantially inverted from a section of a base portion facilitating robust compliance in view of CTE (coefficient of thermal expansion) with respect to a printed circuit board on which it is soldered.

2. Description of Related Art

CPU (Central Processing Unit) used in a computer system is usually mounted on a printed circuit board via a connector, which includes an insulative housing and an array of contacts disposed in the housing. The contact has a contacting section engaged with a conductive pad of the CPU and a soldering section soldered onto the circuit board. Many factors must be taken into consideration when designing and manufacturing a contact, such as compliance, dimension, and cost and so on. There are lots of shortages existing in the conventional contact design, among which the compliance of the contact is mostly likely to result poor coplanarity of the array of contacts when soldered to the circuit board.

U.S. patent publication No. 20070281507 published on Dec. 6, 2007 discloses a typical electrical contact used in a connector for interconnecting two devices. To improve the compliance of the electrical contact, the contact is provided with a double-folded soldering section with a comparable high compliance. When soldered to a printed circuit board via solder balls or the like, the array of the contacts is able to achieve a homogeneous coplanarity because of the better compliance which is ensured by slightly automatic adjustment of the height of the contact if needed. However, it takes a great deal amount of metal material for making the contact to form such an elastic soldering section and is not economic and cost-effect.

In view of the above, an improved electrical contact of high compliance and low cost is needed.

SUMMARY OF THE INVENTION

Accordingly, an object of the present invention is to provide an electrical contact with high compliance while can be made cost-effectively.

According to one aspect of the present invention, there is provided an electrical contact which includes a body section, a contacting arm extending upward from the body section, a soldering section formed by cutting out from the body section and then extending outwardly. The soldering section comprises a first extending arm connected to the body section, a second extending arm bent downwardly from the first extending arm, and a soldering pad extending from the second extending arm toward the body section. An opening is defined after the soldering section is cut out from the body section.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
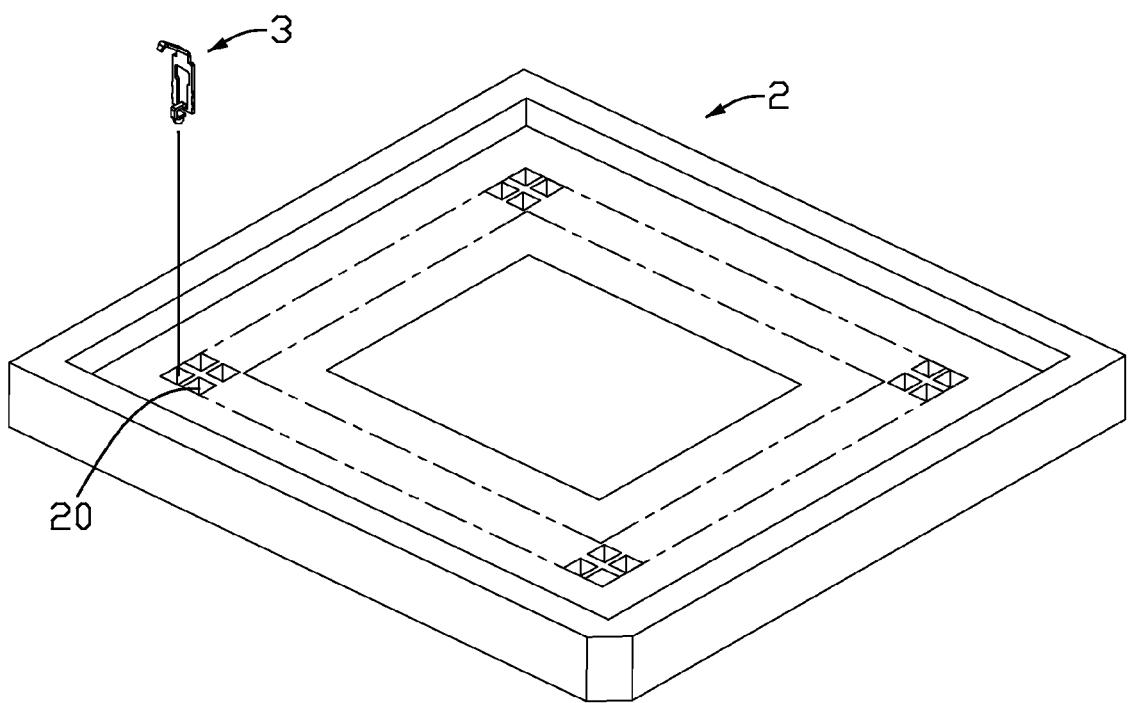
FIG. 1 is an exploded, perspective view of an electrical connector, in which an electrical contact in accordance with a preferred embodiment of the present invention is employed.
Figure 2:
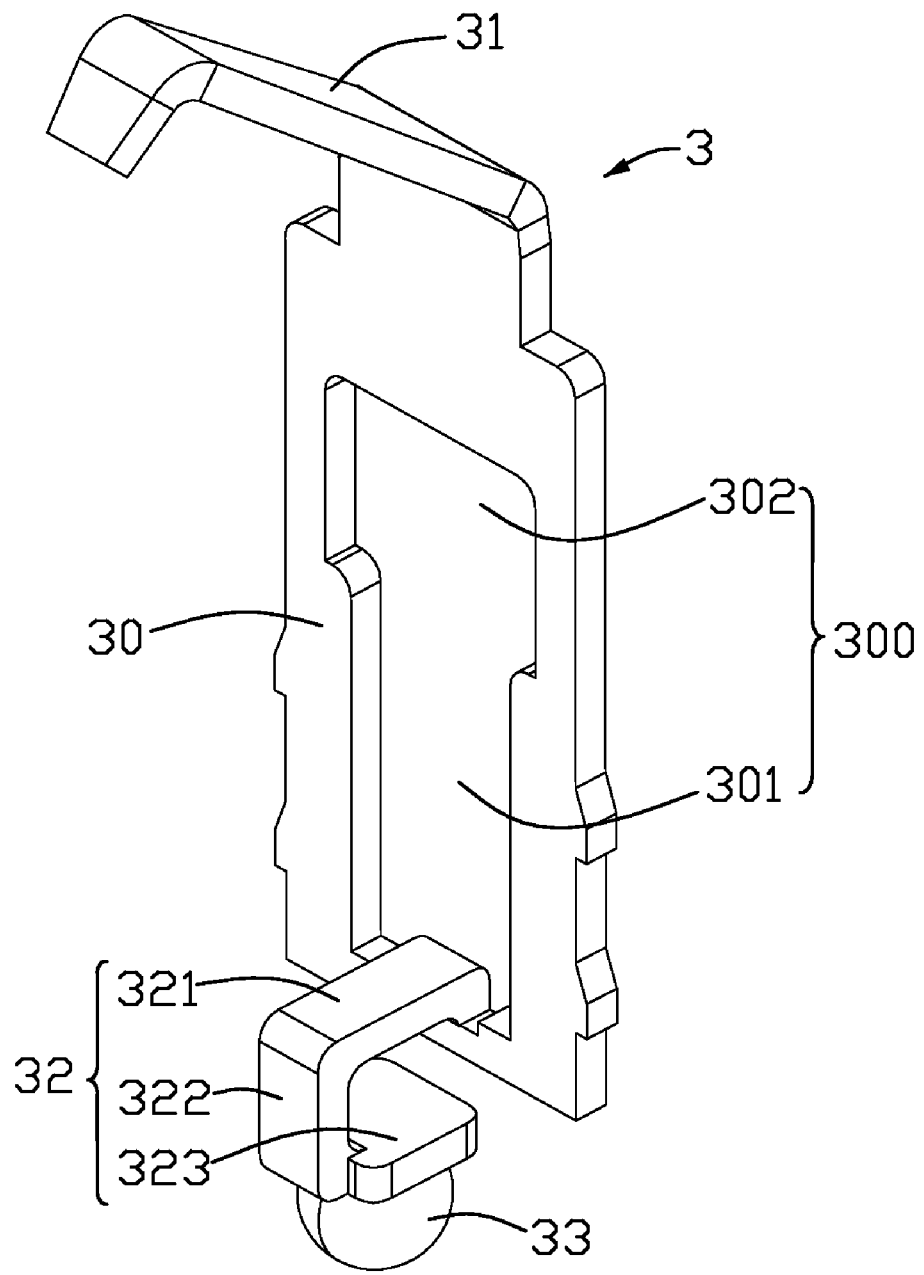
FIG. 2 is a perspective view of the electrical contact shown in FIG. 1.

FIG. 1 illustrates an electrical connector 1 which is assembled with a plurality of electrical contacts 3 (only one is shown in FIG. 1 for illustration) made in accordance with a preferred embodiment of the present invention. Besides, the electrical connector 1 includes an insulative housing 2 which has a plurality of receiving holes 20 to respectively retain the contacts 3.

The contact 3 includes a planar body section 30, a contacting arm 31 extending upward from the body section 30, and a soldering section 32 extending downward from the body section 30. The contacting arm 31 and the soldering section 32 are substantially oriented to a same side of the body section 30 so that the whole contact 3 occupies relative small space in a horizontal direction and thereby reaching a high-density arrangement in the insulative housing 2. The contacting arm 31 is used to contact a conductive pad of an IC package (not shown) that mounted upon the connector 1. The soldering section 32 is attached with a solder ball 33 and thereby able to be soldered to a printed circuit board (not shown) via the solder ball 33.

The soldering section 32 is formed by cutting out from the middle portion of body section 30 and then extending outwardly and downwardly. The soldering section 32 includes a first extending arm 321 extending horizontally and connected to the body section 30, a second extending arm 322 bent downwardly and vertically from the first extending arm 321, and a soldering pad 323 horizontally extending from the low end of the second extending arm 322 and extending toward the body section 30. The first extending arm 321 and the soldering pad 323 are substantially parallel to each other with a distance therebetween and thus making the soldering section 32 to have a substantially U-shape structure. Since the middle portion of body section 30 is carved out, an opening 300 is thereby formed which further constitutes a wider part 302 and a narrower part 301 under the wider part 302. Correspondingly, the soldering pad 323 of the soldering section 32 has a larger width than that of the first and the second extending arms 321, 323.

Due to the substantially U-shaped structure of the soldering section 32, the contact 3 is provided with robust compliance, by this arrangement the coplanarity of an array of the soldering balls 33 of the contacts 3 is significantly improved when soldered to the printed circuit board. In other words, the lowest points of soldering balls 33 are able to be automatically adjusted and located at a same horizontal plane. In addition, since the soldering section 32 is formed by carving out a pre-set portion of the body section 30, the usage of metal material is reduced.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical contact, comprising:
a body section;
a contacting arm extending upward from the body section;
a soldering section formed by cutting out from the body section and then extending outwardly, the soldering section comprising a first extending arm connected to the body section, a second extending arm bent downwardly from the first extending arm, and a soldering pad extending from the second extending arm toward the body section; and an opening defined after the soldering section is cut out from the body section.

2. The electrical contact as claimed in claim 1, wherein the first extending arm and the soldering pad extend horizontally and are parallel to each other.

3. The electrical contact as claimed in claim 1, wherein the first extending arm and the soldering pad define a distance therebetween.

4. The electrical contact as claimed in claim 1, wherein the contacting arm and the soldering section are substantially oriented to a same side of the body section so to occupy a relatively small space in a horizontal direction.

5. The electrical contact as claimed in claim 1, wherein the opening comprises a wider part and a narrower part under the wider part, the soldering pad of the soldering section having a larger width than that of the first and the second extending arms.

6. An electrical contact, comprising: a body section having an opening therein; a contacting arm extending upward from the body section; a soldering section having a substantially U-shaped structure and being conformed in dimension to the opening; wherein the soldering section comprising a horizontal first extending arm and a horizontal soldering pad apart from the first extending arm.

7. An electrical connector comprising:

an insulative housing defining a plurality of passageways; a plurality of contacts disposed in the corresponding passageways, respectively; each of said contacts defining a vertical body section to retain the contact to the housing, a resilient contact arm extending upwardly from an upper region of the body section, and a soldering section having a soldering pad extending from an end portion thereof, said soldering section and solder pad are split from the body section in a final shape;

said solder pad is originally located above said soldering section in a pre-split shape and is located below said soldering section at the final shape; wherein a solder ball is attached to said solder pad.

8. The electrical contact as claimed in claim 6, wherein the soldering section further comprises a second extending arm having two ends respectively perpendicularly connected to the first extending arm and the soldering pad.

9. The electrical contact as claimed in claim 6, wherein the contacting arm and the soldering section are substantially oriented to a same side of the body section so that the whole contact occupies relative small space in a horizontal direction.

10. The electrical contact as claimed in claim 6, wherein the opening comprises a wider part and a narrower part under the wider part, the soldering pad of the soldering section having a larger width than that of the first extending arm.

11. The electrical contact as claimed in claim 6, further comprising a solder ball attached to the soldering pad.

12. The electrical connector as claimed in claim 7, wherein said solder ball is located beside said body section.

13. The electrical connector as claimed in claim 7, wherein said body section defines an opening after splitting.

14. The electrical connector as claimed in claim 13, said opening defines an upper wider section and a lower narrowed section under condition that said solder pad complies with said upper wider section.

15. The electrical connector as claimed in claim 12, wherein said soldering section further includes a horizontal extending arm linked to the joint section, and a vertical extending arm linked between the horizontal extending arm and the solder pad.

* * * * *